United States Patent [19]

Kobayashi

[11] Patent Number: 5,370,709
[45] Date of Patent: Dec. 6, 1994

[54] SEMICONDUCTOR WAFER PROCESSING APPARATUS HAVING A BERNOULLI CHUCK

[75] Inventor: Norio Kobayashi, Yokosuka, Japan

[73] Assignee: Kabushiki Kaisha Toshiba, Kawasaki, Japan

[21] Appl. No.: 731,321

[22] Filed: Jul. 17, 1991

[30] Foreign Application Priority Data

Jul. 18, 1990 [JP] Japan .................. 2-190064

[51] Int. Cl.⁵ .......... H05B 6/78; H01L 21/68
[52] U.S. Cl. ................... 29/25.01; 118/728; 437/925
[58] Field of Search ............. 29/25.01, 25.02; 437/925; 118/728; 414/DIG. 51-57

[56] References Cited

U.S. PATENT DOCUMENTS

| | | | |
|---|---|---|---|
| 4,544,446 | 10/1985 | Cady | 156/639 |
| 4,593,168 | 6/1986 | Amada | 118/728 |
| 4,667,076 | 5/1987 | Amada | 118/728 |
| 4,836,138 | 6/1989 | Robinson et al. | 118/725 |
| 4,981,102 | 1/1991 | Gautreaux et al. | 118/725 |
| 5,002,793 | 3/1991 | Arai | 118/725 |
| 5,016,332 | 5/1991 | Deichelderfer | 29/25.01 |
| 5,020,200 | 6/1991 | Mimasaka et al. | 29/25.01 |
| 5,033,538 | 7/1991 | Wagner et al. | 118/728 |
| 5,131,842 | 7/1992 | Miyazaki et al. | 432/241 |
| 5,225,561 | 7/1993 | Kirlin et al. | 546/256 |

FOREIGN PATENT DOCUMENTS

| | | | |
|---|---|---|---|
| 3536432 | 4/1987 | Germany | 437/925 |
| 56-85826 | 7/1981 | Japan . | |
| 57-210630 | 12/1982 | Japan . | |
| 58-168253 | 10/1983 | Japan . | |
| 59-3944 | 1/1984 | Japan . | |
| 59-57448 | 4/1984 | Japan . | |
| 59-155141 | 9/1984 | Japan . | |
| 63-119220 | 5/1985 | Japan . | |
| 62-193138 | 9/1987 | Japan | 437/925 |
| 0272638 | 3/1990 | Japan . | |
| 0289308 | 3/1990 | Japan . | |

*Primary Examiner*—Olik Chaudhuri
*Assistant Examiner*—David E. Graybill
*Attorney, Agent, or Firm*—Finnegan, Henderson, Farabow, Garrett & Dunner

[57] ABSTRACT

A suction plate is provided in a reaction chamber. In the central portion of the suction plate, there is formed a blowing port for blowing gas to a rear surface of the suction plate. In the blowing port, there are provide pipes for introducing carrier gas and reactant gas. Gas, which is introduced by these pipes, and the suction plate are heated by a lamp formed in the outside of the reaction chamber. If gas introduced by these pipes and reactant gas are blown from the blowing port to the rear of the suction plate in a state that a semiconductor substrate is close to the portion in the vicinity of the suction plate, the semiconductor substrate is sucked to the suction plate in a noncontact state and an epitaxial layer is formed on the semiconductor substrate in this state.

6 Claims, 9 Drawing Sheets

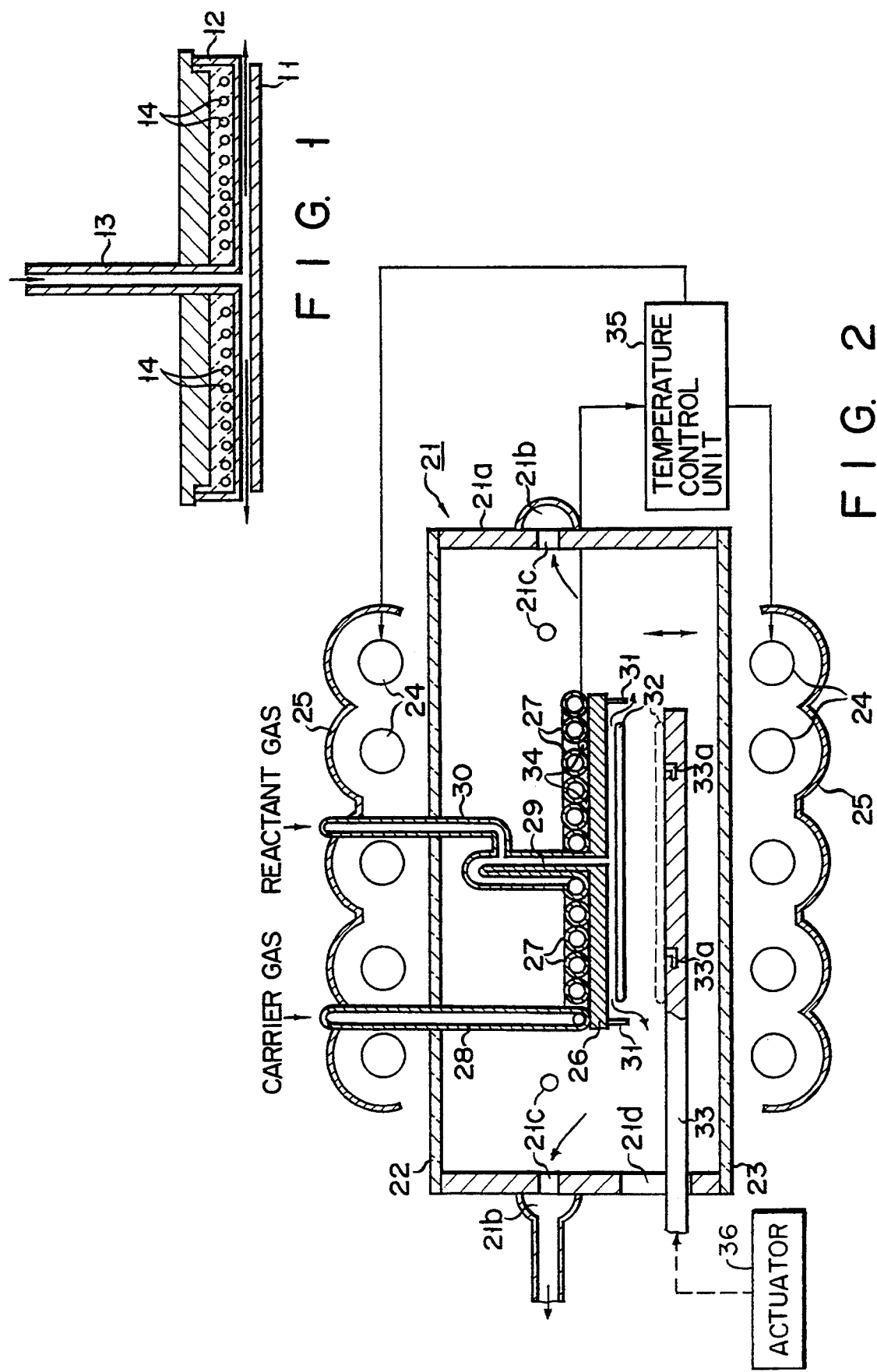

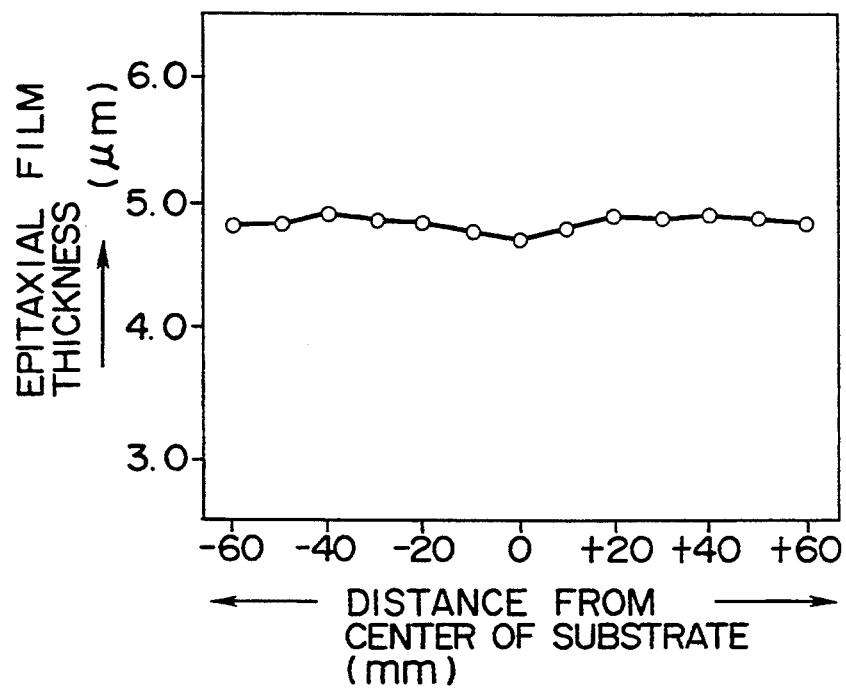
F I G. 3
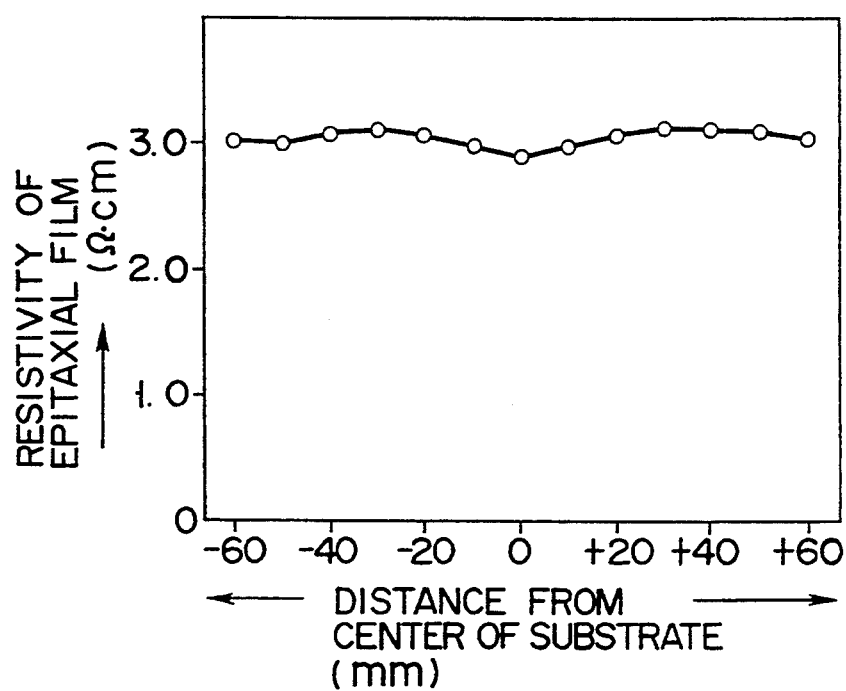
F I G. 4

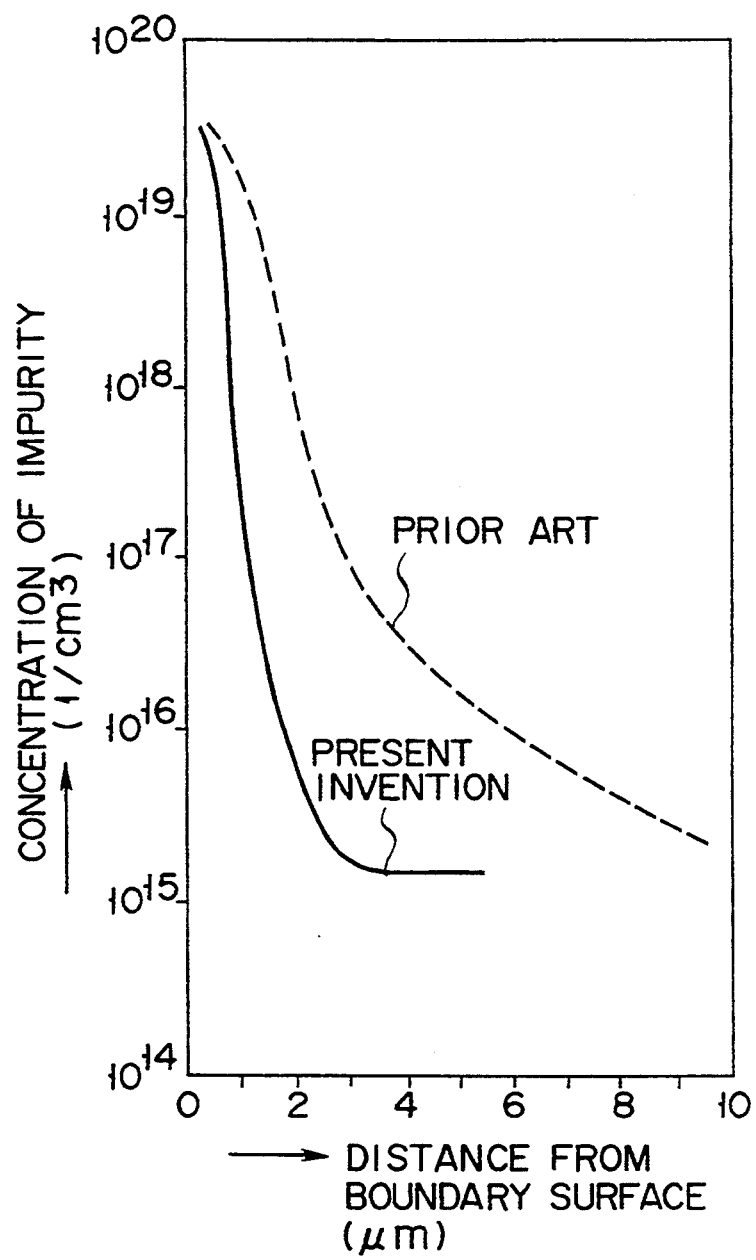
F I G. 5

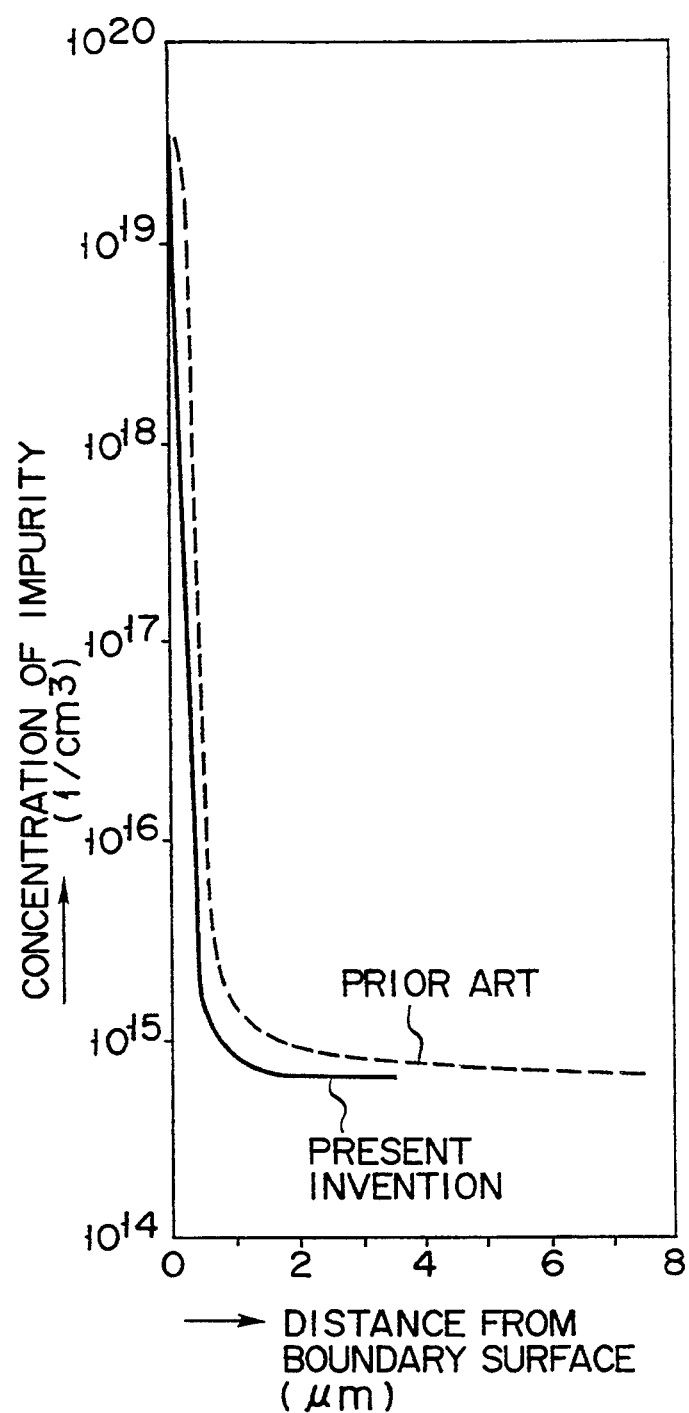
F I G. 8

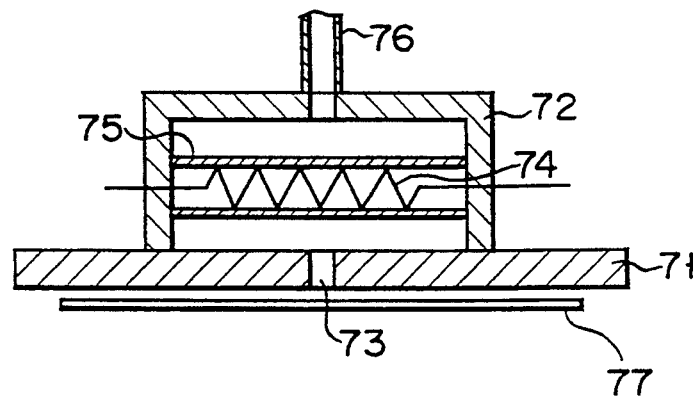
F I G. 13
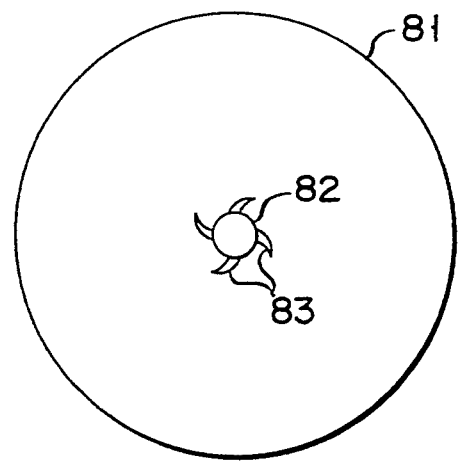
F I G. 14

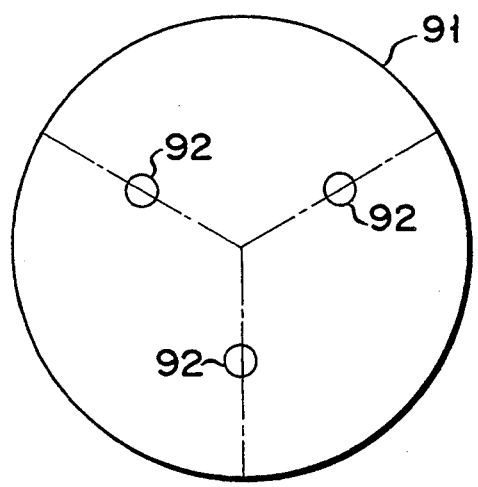
F I G. 15

SEMICONDUCTOR WAFER PROCESSING APPARATUS HAVING A BERNOULLI CHUCK

BACKGROUND OF THE INVENTION

1. Field of the Invention

The present invention relates to a semiconductor processing method, which is applied to an epitaxial growth, and its apparatus.

2. Description of the Related Art

In general, epitaxial growth of silicon (Si) means a vapor phase epitaxy. The vapor phase epitaxial method can be classified into a CVD (chemical vapor deposition) method and a PVD (physical vapor deposition) method.

At present, the CVD method is mainly used in the vapor phase epitaxial growth technique, which is used in manufacturing a semiconductor apparatus. The CVD method can be divided into a hydrogen reduction method and a thermal decomposition method due to the difference in the chemical reaction.

The greatest merits of the epitaxial growth is that an arbitrary conductive type and resistivity layer having an arbitrary thickness can be formed on a substrate. Due to this, it is possible to easily form n+n structure or p+p structure to lower a series resistance in a discrete device such as a transistor, a diode, and the like. In the case of a bipolar IC, an epitaxial layer is formed on the substrate and a bury layer is formed between the substrate and the epitaxial layer, and thereby the series resistance of a collector can be reduced and pn junction and separation can be made. Moreover, in MOSIC, by use of the epitaxial technique, prevention of latching up, reduction of parasitic capacity, and measures against alpha rays can be performed. Moreover, a gettering function is provided in a silicon wafer and the epitaxial layer is completely crystallized in a wafer surface layer so that a leak current can be reduced.

In the case where the epitaxial layer is applied to the above-mentioned apparatus, the following quality can be generally required.

1. The surface is flat, that is, no projection is formed, and smooth;
2. There are not formed stacking fault and crystal defect such as dislocation;
3. There is no auto-doping;
4. There is no pattern deformation and disappearance; and
5. There are good uniformity of a film thickness and that of resistivity.

FIG. 16 shows a conventional vertical furnace which is used to grow the epitaxial layer. In the vertical furnace, there is formed a disc-type heater susceptor 2 rotating in a reaction chamber 1. On the susceptor 2, a plurality of wafers 3 is mounted. A pipe 4 is formed in the central portion of the susceptor 2, and reactant gas is introduced into the interior of the reaction chamber 1 via the pipe 4. A pipe 5 is formed in the reaction chamber 1 and residual gas is discharged from the reaction chamber 1 via the pipe 5. A monitor wafer (not shown) is radially arranged on the upper surface of the susceptor 2. The whole processing state is represented by the processing state of the monitor wafer.

However, the epitaxial growth and the CVD film growth by the above conventional apparatus have the following problems:

(a) Since the volume of the reaction chamber 1 is large, a large amount of time for exchanging reactant gas is required. Due to this, there are disadvantages in the following points:

Specifically, in the case of epitaxial growth, the impurity profile is largely changed by auto-doping effect. Moreover, in the case of CVD film, evaporated material is easily introduced into the CVD film from the substrate due to the basically the same effect as the case of the epitaxial growth. Furthermore, much time for purging the exchange of reactant gas is required, and a large amount of purge gas is needed.

(b) Since the heated susceptor 2 and the wafer 3 are formed in the reaction chamber 1, the flow of gas causes turbulence and dust is easily generated. Then, the generated dust easily adheres to the wafer 3.

(c) The wafer 3 must be arranged on the susceptor 2. At this time, dust is easily generated by the contact of the wafer and the susceptor. Moreover, the wafer 3 is easily contaminated by the material forming the susceptor 2.

(d) Since the susceptor 2 is needed, the susceptor 2 having a large amount of heat capacity must be heated in addition to the wafer 3. Due to this, a lot of time for heating and cooling is required and energy efficiency is bad.

(e) In consideration of the uniformity of the film formed in the wafer 3 and its quality, a batch process system wherein a large amount of wafers is processed at the same time is disadvantageous as compared with a single wafer process system wherein the wafer is processed one by one.

SUMMARY OF THE INVENTION

An object of the present invention is to provide a semiconductor processing method and its method wherein generation of dust can be prevented, the change of impurity profile due to auto-doping can be prevented by performing the exchange of reactant gas for a short period time, the amount of purge gas can be largely reduced, and epitaxial growth film and CVD film, which have good quality, can be efficiently formed.

The above-mentioned object can be achieved by the following structure:

A semiconductor processing apparatus, comprising
a containing unit;
a suction plate provided in said containing unit, having a blowing port for blowing gas, and sucking a semiconductor substrate thereto by gas blown from said blowing port; and
heating means for heating the gas and the semiconductor substrate.

According to the present invention, a semiconductor substrate is sucked to a suction plate in a non-contact state by gas blown from the rear surface of the suction plate. Under this state, the semiconductor substrate is heated. Therefore, since the semiconductor substrate does not come in contact with any member, no dust is generated and it is possible to prevent a foreign substance from being sucked to the semiconductor substrate.

Furthermore, since gas which is blown from the rear surface of the suction plate flows into the surface of the semiconductor substrate at a high speed, the replacement of gas is rapidly performed, and auto-doping can be prevented.

Since the semiconductor substrate is sucked to the suction plate with a slight space, the substantial reactive capacity is small and the consumption of gas can be reduced, and the time for purging gas can be shortened.

Moreover, since the susceptor having large heat capacity is not used unlike the prior art, the consumption of electric power can be reduced.

Furthermore, the above-mentioned method is effective in the case in which a vapor-phase growth film or an epitaxial film is formed in the semiconductor substrate, or the case in which vapor-phase etching is performed in the semiconductor substrate.

Moreover, in the case where the semiconductor substrate is processed in a state where the semiconductor substrate is rotated by gas blown from the rear surface of the suction plate, the film to be formed in the semiconductor substrate is further uniformly formed.

The semiconductor substrate is not limited to the Si substrate. For example, a GaAs substrate of GaAs, or a GaP substrate of GaP, may be used.

Furthermore, according to the present invention, a carrier gas and a reactant gas are used. The reactant gas may be mixed right before carrier gas blown from the suction plate since the chemical reaction does not advance.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view explaining a basic concept of the method of the present invention;

FIG. 2 is a side cross sectional view showing a first embodiment of the apparatus of the present invention;

FIGS. 3 to 5 show the result of which an epitaxial growth of Si using $SiHCl_3$ is performed by the apparatus of FIG. 2, respectively;

FIGS. 6 to 8 show the result of which an epitaxial growth of Si using $SiH_4$ is performed by the apparatus of FIG. 2, respectively;

FIG. 13 shows a fourth embodiment of the apparatus of the present invention, and is a cross sectional view showing a suction plate;

FIG. 14 shows a fifth embodiment of the apparatus of the present invention, and is a bottom view showing a suction plate;

FIG. 15 shows a sixth embodiment of the apparatus of the present invention, and is a bottom view showing a suction plate.

DETAILED DESCRIPTION OF THE PREFERRED EMBODIMENTS

Figure 6:
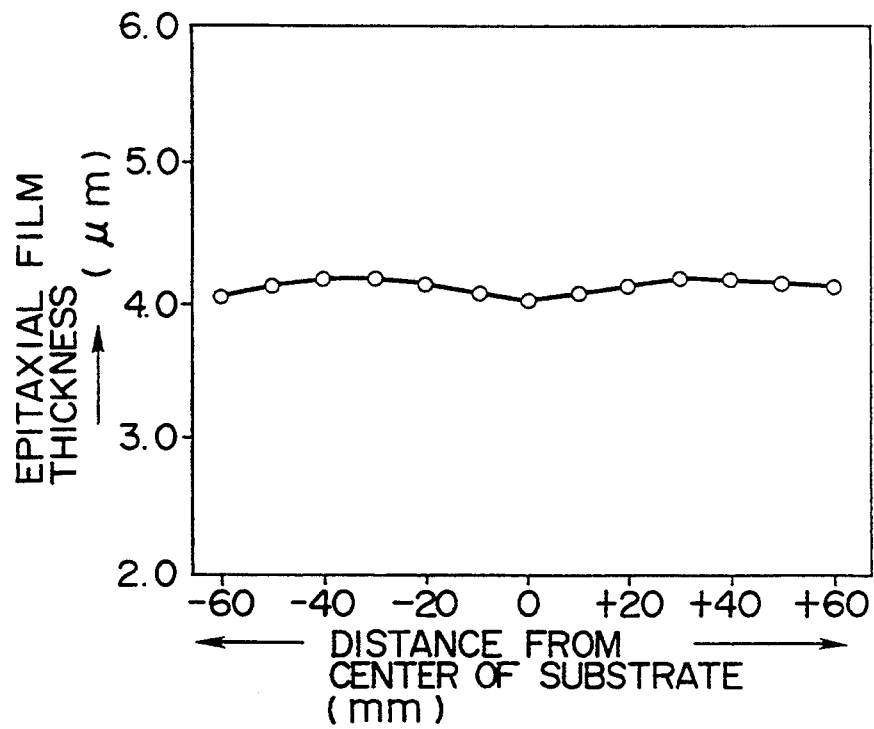

The embodiment of the present invention will be explained with reference to the drawings.

First of all, the principle of this invention will be explained with reference to FIG. 1.

In an epitaxial growth, the point that impurity of a substrate is introduced into a film, that is, autodoping, is a fundamental problem. As a measure to prevent this point, there is a general method in which raw gas is changed to gas of a thermal decomposition method from gas of a hydrogen reduction method, and the processing temperature is lowered. However, it is effective in removing impurity evaporated from the substrate for a short period of time. As a method for removing the impurity, there is a general method in which volume of a reaction chamber is made small and a flow rate of carrier gas is increased. In consideration of this point, FIG. 1 shows the ultimate structure.

In FIG. 1, a parallel plate (hereinafter called a "suction plate") 12 is provided to be parallel with a substrate 11 serving as a wafer. A pipe 13 is provided in the central portion of the suction plate 12, and gas flows from the pipe 13 at more than a certain pressure. Then, gas passes through a gap between the substrate 11 and the suction plate 12 and flows toward the substrate 11 and the surroundings of the suction plate 12 at high speed. At this time, on the basis of Bernoulli's theorem showing the law of energy conservation relating to fluid movement, the pressure between the substrate 11 and the suction plate 12 is lower as compared with the surrounding pressure. As a result, a suction force acts on the substrate 11 in the direction of the suction plate 12. Then, the substrate 11 is sucked to the suction plate 12 in a state where a necessary gap is maintained since gas flows between the substrate 11 and the suction plate 12. Moreover, in the suction plate 12, there is a heating mechanism 14 such as a heater. Under the state where the substrate 11 is heated by the heating mechanism 14, raw gas is in contact with the substrate 11. The above is the basic concept of this invention.

Gas flows between the substrate 11 and the suction plate 12, thereby reducing auto-doping and preventing dust from being attached to the substrate. Also, the substrate is processed to be formed one by one so that uniformity of the film can be improved.

Furthermore, according to the above-mentioned method, since no susceptor is needed, the amount of material to be heated can be reduced, heating and cooling can be rapidly performed, and time for maintaining at high temperature can be reduced.

FIG. 2 shows a first embodiment of the apparatus of the present invention.

A reaction chamber 21 is formed of a side wall 21a, which is made of stainless steel, and transparent quartz plates 22 and 23 in its upper and lower surfaces. The side wall 21a is cooled by a water cooling apparatus (not shown). An exhaust pipe 21b is formed around the side wall 21a. Moreover, a plurality of exhaust ports 21c are formed around the side wall 21a to introduce gas in the reaction chamber 12 into the exhaust pipe 21b. Also, in a part of the side wall 21a, there is an opening 21d, which freely opens and closes to take the substrate in and out of the reaction chamber 21.

In the vicinity of the transparent quartz plates 22 and 23, which is positioned in the outside of the reaction chamber 21, there is provided a plurality of heating lamps 24. The outputs of the lamps 24 are 1.2 kW per ten lamps. In the back surfaces of the lamps 24, there are provided reflecting plates 25 reflecting light and heat in the reaction chamber 21. A Si substrate 32, a reactant gas, and a carrier gas are heated by the heating lamps 24 respectively through the transparent quartz plates 22 and 23. These lamps 24 and transparent quartz plates 22 and 23 are cooled by a large amount of air supplied by a cooling apparatus (not shown), and no reaction generation film is grown in the inner surface of the transparent quartz plates 22 and 23.

Also, in the reaction chamber 21, there is formed a suction plate 26, which is disc-shaped and has an area which is equal to an object to be sucked or larger than the object. In the surface of the suction plate 26, a pipe 27 is arranged in a spiral manner. In one end of the pipe 27, there is provided a pipe 28 introducing carrier gas. In the other end, there is provided a nozzle 29, which is formed in the central portion of the suction plate 26, and has a diameter of about 1 mm. The top end of the nozzle 29 is positioned in the center of the rear surface portion of the suction plate 26, that is, close to the center of gravity of a substance to be sucked. There is provided a pipe 30 introducing raw gas at the portion which is the other end of the pipe 27 and close to the connecting portion of the nozzle 29. The rear surface portion of the suction plate 26 is formed to be smooth and a stopper 31 is provided at four places in the periphery of the rear surface portion. In FIG. 2, only two of these stoppers are shown. The suction plate 26, the stopper 31, the pipes 27, 28, 30, and the nozzle 29 are made of quartz, respectively.

Carrier gas introduced into the pipe 28 is sent to the spiral-shaped pipe 27, and preheated up to near the temperature of a Si substrate 32 to be explained later. Then reactant gas introduced from the pipe 30 is mixed with the preheated carrier gas, and blown from nozzle 29 to the rear surface portion of the suction plate 26.

The reason why reactant gas is mixed with the preheated gas is to prevent the chemical reaction of reactant gas due to heat.

The Si substrate 32 is supported in a support 33, which is inserted from the opening 21d formed in the reaction chamber 21. In the support 33, there is formed a nozzle 33a forming a vacuum chuck. The Si substrate 32 is supported in the support 33 by the vacuum chuck as shown by a broken line. The support 33 can be moved up and down in the reaction chamber 21 by actuator 36. If the vacuum chuck is released in a state that the Si substrate 32 is close to the suction plate 26, the Si substrate 32 is sucked to the rear surface portion of the suction plate 26 to have a space having a substantially 1 mm to 0.5 mm by the function of gas blown from the nozzle 29 as shown by a solid line of this figure.

In the above-mentioned state, the support 33 is taken out of the reaction chamber 21, and a predetermined epitaxial growth process is executed. If the process is finished, the support 33 is inserted in the reaction chamber 33 again, and is made close to the Si substrate 32. In this state, if the supply of carrier gas is stopped, the Si substrate 32 goes down on the support 33. Thereafter, the vacuum chuck is operated, the Si substrate 32 is supported in the support 33 and is transferred from the reaction chamber 21 in this state. In the course of the process of the substrate, the support 33 is suitable taken in or out of the reaction chamber and can support the substrate 32.

Moreover, there is a plurality of thermocouple devices 34, such as platinum-platinum rhodium thermocouples, arranged between the coil-shaped pipe 27 an the suction plate 26. The output signals of the thermocouples 34 are supplied to a temperature controller 35. The temperature controller 35 controls electric power of the lamps 24 in accordance with the output signals of the plurality of thermocouples 34. In other words, the temperature controller 35 controls electric power of the lamps 24, which are positioned at the portions corresponding to the thermocouples 34, in accordance with the output signals of the plurality of thermocouples 34, so that the surface of the substrate can be uniformly heated.

In practice, the thermocouples were bonded to the Si substrate in advance, and the relationship between the temperature of Si substrate and that of the suction plate was examined. Then, the temperature of the Si Substrate was estimated from the temperature of the suction plate in performing the Si epitaxial growth.

[First Process Embodiment]

Next, it is shown that one example of the result of which the Si epitaxial growth was performed.

Trichlorosilane ($SiHCl_3$) of 3 g/min as raw gas and hydrogen ($H_2$) of 60 l/min as carrier gas flowed and temperature of the Si substrate 32 was controlled to about 1140° C., so that Si epitaxial growth film, whose growth speed of 2.4 $\mu$/min is substantially equal, was obtained. The specific process will be explained as follows:

First, N-type Si substrate 32 having a diameter of 125 mm, a resistivity of about 0.002 $\Omega$cm, and arsenic (As), which was doped, was sucked to the suction plate 26, and the atmosphere in the reaction chamber 21 was substituted for $H_2$ for about 15 seconds. Thereafter, surfaces of the substrate were heated by the heating lamp 24, and the temperature set at a predetermined temperature of 1140° C. for about 1 minute and 45 seconds. In this state, the substrate was left as it was for about 1 minute, and a natural oxidation film on the surface of the Si substrate 32 was removed. Thereafter, trichlorosilane ($SiHCl_3$) containing phosphorus hydroxide ($PH_3$) as a doping gas flowed from the pipe 30 introducing reactant gas and Si epitaxial growth was performed for 2 minutes. Thereafter, the supply of $SiHCl_3$ was stopped, and the lamp 24 was turned off after 5 seconds. Then, after cooling for 3 minutes, the Si substrate was taken up and the epitaxial growth layer was evaluated.

FIG. 3 shows a distribution of the film thickness of the epitaxial growth film in the Si substrate surface at this time, and FIG. 4 shows a distribution of the resistance value.

FIG. 5 shows the result wherein the profile of impurity of the epitaxial growth layer is measured from the Si substrate by a spreading resistance measuring method in order to discriminate the auto-doping effect of the Si substrate. In this figure, the typical example of the impurity profile due to the conventional vertical VG apparatus and the combination of the same kind of reactant gas is shown by a dotted line for reference. It is obvious from this result that the auto-doping effect is considerably improved.

Moreover, the epitaxial growth was performed in twenty Si substrates continuously, and the number of foreign substances adhered to the substrates was measured. As a result, foreign substances of 0.3 $\mu$m and more were not found.

[Second Process Embodiment]

Next, there is explained an example in which Si epitaxial growth is performed by SiH$_4$ gas in place of SiHCl$_3$ gas. The points, which are different from the case of SiHCl$_3$ gas, are that growth temperature is lowered to 1000° C., the flow rate of SiH$_4$ gas is 15 cc/min, PH$_3$ of 0.5 ppm is set to 20 cc/min, the heat heating time is set to 1 minute and 5 seconds, and time for leaving the substrate in H$_2$ at 1000° C. is increased to 1 minute and 30 seconds.

Figure 7:
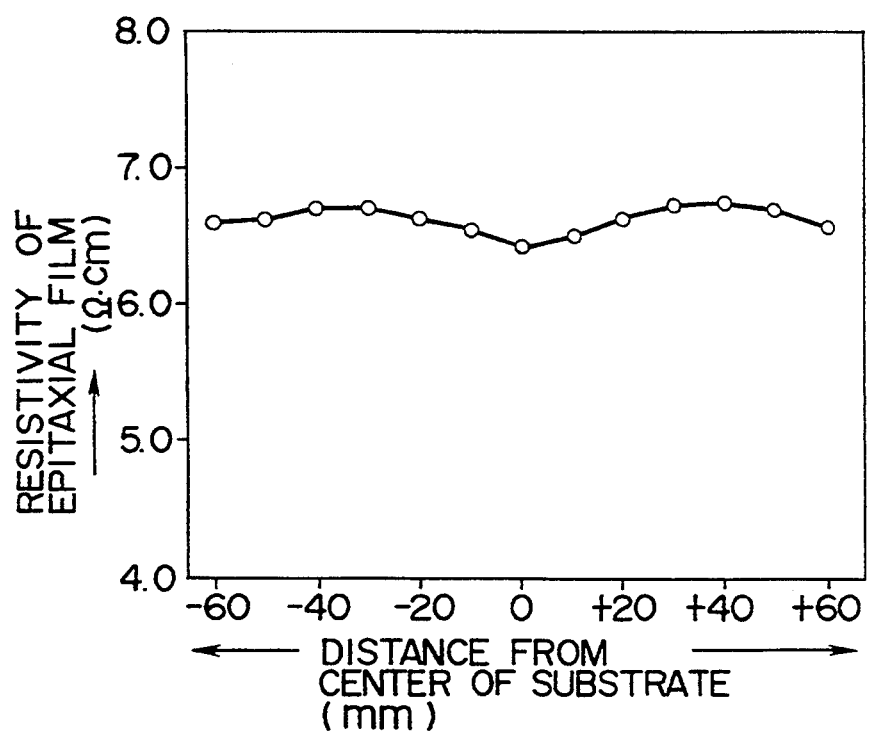

FIG. 6 shows a distribution of the thickness of the film in the Si substrate in the above-mentioned state, and FIG. 7 is a distribution of resistance value.

FIG. 8 shows the result of the measurement of the impurity profile as a measurement of the auto-doping effect.

As shown in FIG. 8, the second process embodiment is obviously improved as compared with the conventional method. This is basically because gas exchange is instantaneously performed. For this reason, doping due to evaporation of impurity from the substrate is controlled. Moreover, since the heating time is short, the profile is prevented from being deteriorated by diffusion. Regarding adherence of foreign substances, foreign substances of 0.3 μm and more were not found similar to the first embodiment.

Next, there is explained a case in which a SiO$_2$ film using SiH$_4$ and O$_2$ is grown.

Figure 9:
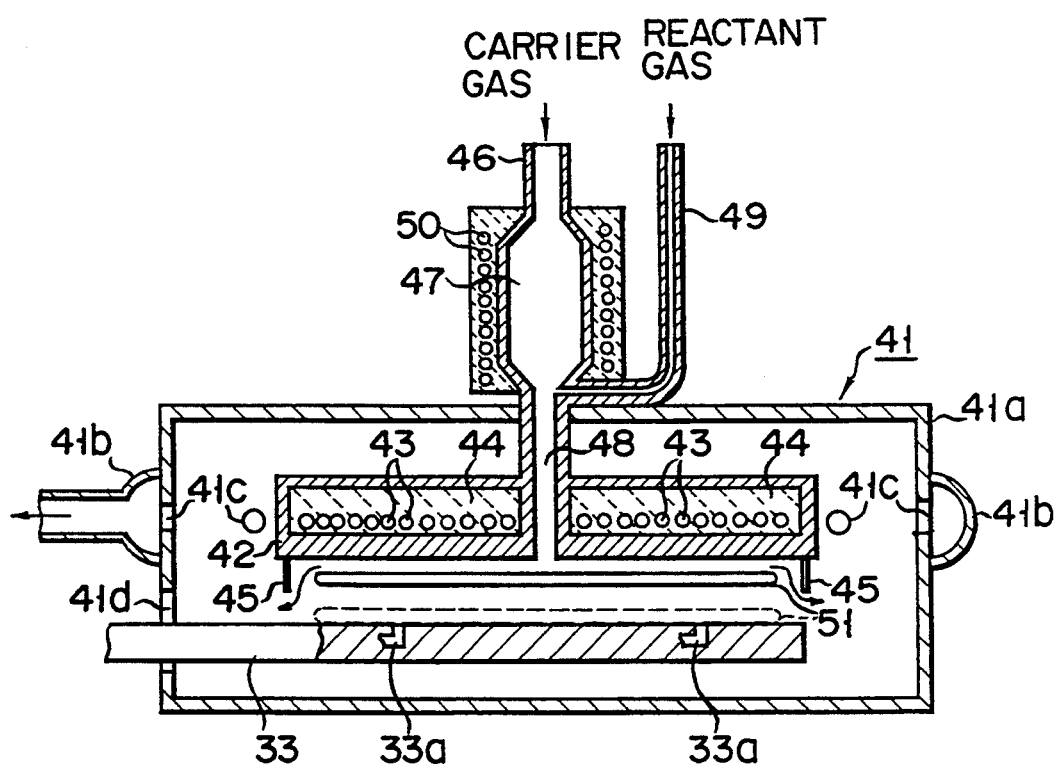
FIG. 9 is a side cross sectional view showing a second embodiment of the apparatus of the present invention.

FIG. 9 shows the apparatus used in this case, and shows the second embodiment of the apparatus relating to the present invention. In the first apparatus embodiment, the gas and the Si substrate are heated by the lamp. In the second apparatus embodiment, a resistance heating system is used.

An entire reaction chamber 41 is made of stainless steel and cooled by a water cooling apparatus (not shown). An exhaust pipe 41b is formed around a side wall 41a. Moreover, a plurality of exhaust ports 41c are formed around the side wall 21a to introduce gas in the reaction chamber 41 into the exhaust pipe 41b. Also, in a part of the side wall 41a, there is an opening 41d, which freely opens and closes to take the substrate in and out of the reaction chamber 41.

In the reaction chamber 41, there is provided, for example, a suction plate 42, which is disc-shaped and formed of aluminum. In the suction plate 42, there is provided a resistance heater 43. Also, there is contained an insulating material 44 such as a ceramic, which electrically insulates the resistance heater 43 and the suction plate 42 from each other. A plurality of stoppers 45 is formed to prevent the Si substrate from being detached from the suction plate 42.

In the outside of the reaction chamber 41, there is a pipe 46 for introducing nitrogen gas N$_2$ as carrier gas. The pipe 46 is connected to a nozzle 48 formed in the central portion of the suction plate 42 via a cavity having a large diameter. In the connecting portion between the cavity 47 and the nozzle 48, there is provided a pipe 49 for introducing reactant gas. Moreover, a resistance heater 50 is provided around the cavity 47.

According to the above-mentioned structure, carrier gas, which is introduced into the pipe 46, is preheated by the heater 50. The preheated carrier gas is mixed with SiH$_4$ serving as raw gas, which is introduced from the pipe 49, and blown to the rear portion of the suction plate 42 from the nozzle 48. Therefore, a substrate 51, which is supported in the vicinity of the suction plate 42 by the support 33, is sucked to the suction plate 42 to have an extremely small space therebetween.

[Third Process Embodiment]

Next, there are explained the working conditions when the above-structured apparatus is used.

N$_2$ is used as carrier gas and SiH$_4$ gas of 10% having an Ar base is used as reactant gas. Growth temperature of SiO$_2$ film is set to, for example, 450° C., and this temperature is detected by a thermocouple (not shown), which is incorporated into the suction plate 42. It is provided that the electric power of the heater 43 is controlled in accordance with the detected output of the thermocouple, so that the growth temperature is maintained to be constant.

Next, there are explained the performed steps.

First of all, carrier gas N$_2$ of 50 l/min was into the pipe 45 and the Si substrate 51 was sucked to the suction plate 42 and then temperature was increased. The temperature of Si substrate 51 reached to 450° C. after about 1 minute and 20 seconds. Then, the substrate 51 was left as it was for about 20 seconds and the distribution of temperature was stabilized. Next, O$_2$ of 1 l/min was added to carrier gas N$_2$, 10% of SiH$_4$ gas of 0.7 l/min having Ar base was sent therein from the pipe 49 for introducing raw material, and an SiO$_2$ film was grown on the Si substrate 51. After SiO$_2$ film was grown for 2 minutes, the supply of reactant gas was stopped. Moreover, the power of the resistance heaters 43 and 50 were turned off, and the SiO$_2$ film was cooled for about 2 minutes.

Figure 10:
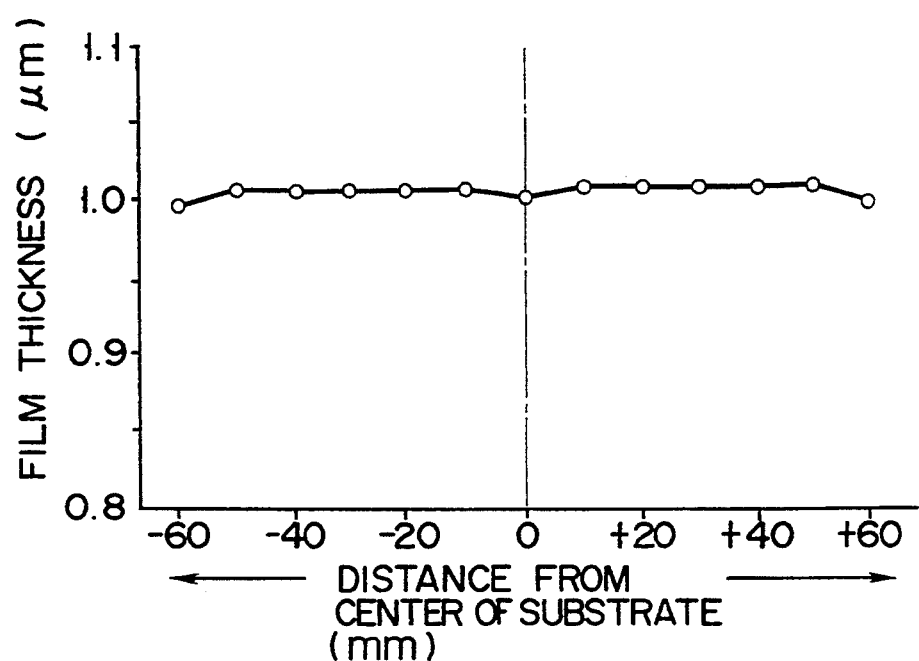
FIG. 10 shows the result of which a growth of a $SiO_2$ film is performed by the apparatus of FIG. 9.

FIG. 10 shows the distribution of the thickness of SiO$_2$ film, which is grown as mentioned above, in the Si substrate 51. As is obvious from FIG. 10, there can be grown the film having extremely good uniformity such as the thickness of 1.0 μm±0.05 μm.

By the same method, the SiO$_2$ film was grown on twenty Si substrates, and the number of foreign substances such as dust adhered to the substrates was measured. As a result, no foreign substances of 0.3 μm and more were not found.

According to the above embodiment, the following effects can be obtained:

(a) In the case of the epitaxial growth, the change of the impurity profile due to auto-doping can be largely improved and arbitrary impurity profile can be easily obtained. In other words, the following reasons can be considered. Specifically, a space, which is necessary for the vapor-phase reaction, is limited to the Si substrate and a narrow gap of the suction plate, thereby substitution time for reaction gas is extremely shortened. The flow rate of carrier gas, which is necessary for the adherence of Si substrate, to the surface of Si substrate becomes considerably faster than the conventional method.

Moreover, since the flow rate of gas becomes faster, the vapor-phase reaction is changed to the reaction control from the diffusion control, so that the epitaxial growth speed becomes fast. Therefore, the profile does not dull.

(b) The number of foreign substances which adhere can be extremely lessened. More specifically, in the conventional method, the foreign substances are generated by removing reaction products from the wall of the cooled reaction chamber. Moreover, the foreign substances are blown up by turbulent gas in the reaction chamber, so that the substances often adhere to the Si substrate. In contrast, according to the method of the present invention, both the temperature of the Si substrate, which corresponds to the wall of the reaction chamber of the prior art, and that of the suction plate, are increased to the reaction temperature. Due to this, there is formed a film having strong suction in the Si substrate and the suction plate, the reaction products little remove, so that no dust is generated.

Moreover, it can be considered as reason of generating other foreign substances that fine powder of the reaction material is formed. According to the method of the present invention, since such fine powder is easily blown to the outside of the Si substrate surface by rapid gas flow, such fine powder can be prevented from being left on the surface of the Si substrate.

Furthermore, in the conventional method, when the Si substrate was arranged on the susceptor, dust was generated by the contact between the Si substrate and the susceptor. In the method of the present invention, there is no member corresponding to the conventional susceptor, and there is always gas flow between the suction plate and the Si substrate which are not in contact with each other. Due to this, neither generation of foreign substances nor adherence of foreign substances occurs. Thereby, film growth having no adherence of foreign substances can be attained.

(c) Energy efficiency is high.

More specifically, an object to be heated is essentially only the Si substrate, the suction plate and carrier gas. Therefore, unlike the prior art, the susceptor having large heat capacity is unnecessary, the amount of electric power used can be largely reduced.

Also, since the substantial volume of the reaction chamber is small, the amount of carrier gas to be used can be reduced and is economically advantageous.

(d) Uniformity of formed film is good.

In order to obtain uniformity of the formed film, it is required that the temperature distribution is uniform and concentration of reactant gas is constant at an arbitrary place of the surface of the Si substrate. In the general vapor-phase reaction, a reaction boundary layer (stagnant layer) is formed to enclose the Si substrate, and this prevents new reactant gas from entering the substrate. Due to this, uniformity of the formed film cannot be attained if concentration of reactant gas is only made uniform. In the method of the present invention, since the reaction boundary layer is removed by rapid gas flow, the reaction is determined by only temperature and concentration of reactant gas. Therefore, the uniform film quality can be easily obtained.

The above-mentioned embodiment explained the epitaxial growth using the Si substrate and the growth of $SiO_2$ film. The present invention can be applied to the other substrate such as GaAs substrate and GaP substrate other than Si substrate.

[Fourth Process Embodiment]

Similar to the first and second process embodiments, in the fourth embodiment, non-doped GaAs was vapor-phase-grown on a N+GaAs substrate by use of the apparatus shown in FIG. 1.

The above substrate was N+GaAs substrate having a diameter of 50 mm and its carrier concentration was $5 \times 10^{18}$ cm$^{-3}$, and its crystal face orientation was (100). The growth temperature was 600° C. As reactant gas, there was used trimethyl gallium $(Ga(CH_3)_3)$ of $2.0 \times 10^{31}$ $^{18}$ cm$^{-3}$ mol/min and arsine $(ASH_3)$ of $2.0 \times 10^{-4}$ mol/min. As carrier gas, there was used hydrogen $(H_2)$ of 10 l/min.

The substrate was set in the apparatus and carrier gas $(H_2)$ was supplied thereto for about 10 minutes, and sufficiently substituted. Thereafter, heating was started and reactant gas was sent 10 minutes later after temperature reached to 600° C., and non-doped GaAs crystal was grown on the substrate for 60 minutes. Thereafter, the supply of reactant gas was stopped, the temperature was reduced, and the reaction quality was substituted for nitrogen gas $(N_2)$ for 10 minutes (10 l/min). Thereafter, GaAs substrate was taken up and the thickness of the epitaxial layer was measured.

Figure 11:
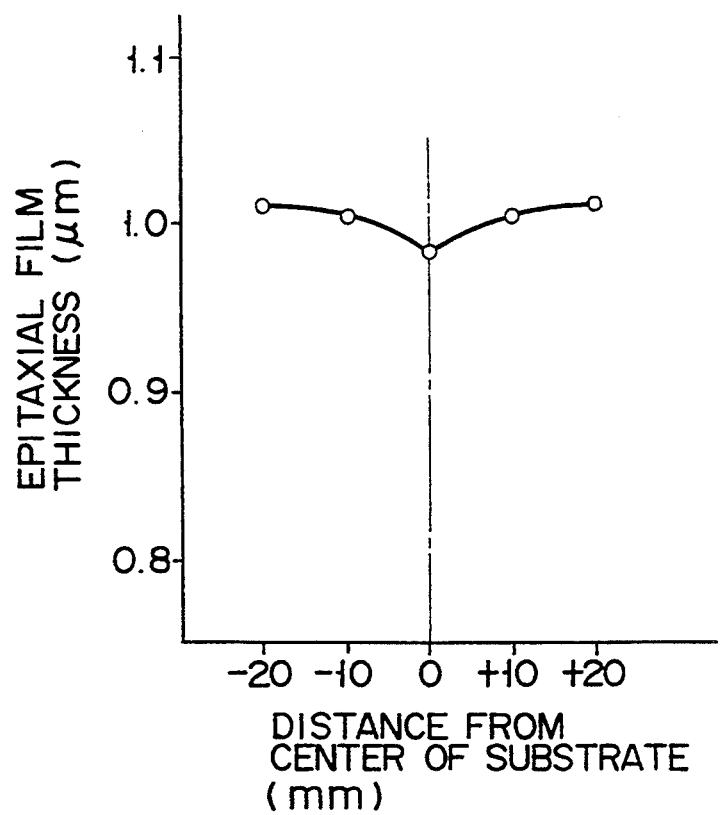
FIG. 11 shows the result of which an epitaxial growth of a GaAs substrate is performed.

FIG. 11 shows the result of the above process. As is obvious from FIG. 11, uniformity of the formed film can be obtained in 3% surface against the epitaxial layer having a thickness of 1.0 μm.

As mentioned above, the same effect as that of first and second process embodiments can be obtained even in a case where the epitaxial layer is formed on the GaAs substrate.

The above first to fourth process embodiments explain the case in which the epitaxial film was formed. The present invention is not limited to such a case. For example, the method and the apparatus of the present invention may be used in a simple heat treatment such as the so-called rapid anneal, or a vapor etching.

Figure 12:
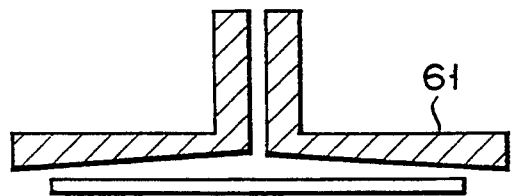
FIG. 12 shows a third embodiment of the apparatus of the present invention, and is a cross sectional view showing a suction plate.
Figure 16:
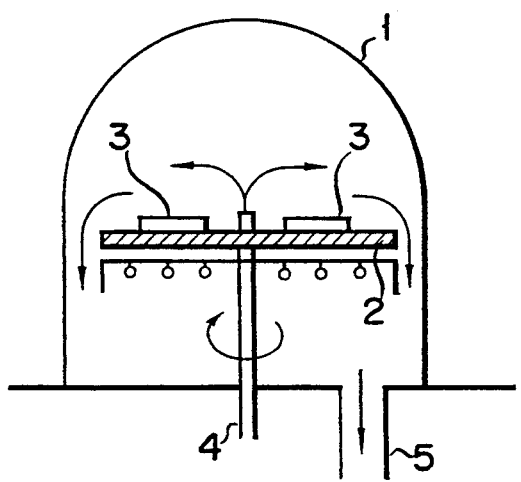
FIG. 16 is a schematic view showing a conventional vapor-phase apparatus.

FIG. 12 shows the third apparatus embodiment of the present invention. In this embodiment, the shape of the suction plate is changed. As shown in FIG. 12, a rear surface of a suction plate 61 is inclined from the central portion to the surrounding direction, and is umbrella-shaped. The same suction function as that of the other embodiments can be obtained by this structure.

FIG. 13 shows the fourth apparatus embodiment of the present invention. In any embodiments explained above, there is provided the pipe for introducing gas into the suction plate, and gas is introduced into the rear surface of the suction plate by the pipe. In the fourth apparatus embodiment, there is provided a housing 72 for containing gas in the surface of a suction plate 71 formed in the reaction chamber (not shown). The housing 72 is communicated with the rear surface of the suction plate 71 through a nozzle (gas blowing port) formed in the central portion of the suction plate 71. In the housing 72, there is provided a heater 74. The heater 74 is contained in a quartz tube 75. In the housing 72, there is provided a pipe 76 for introducing gas into the housing 72. Gas, which is introduced into the housing 72, is heated by the heater 74 and blown to the rear surface of the suction plate 71 from the nozzle 73. Therefore, a semiconductor substrate 77 is sucked to the suction plate 71 in a non-contact state by the blown gas. This embodiment is suitable for annealing a substrate using in active gas such as argon (Ar).

FIG. 14 shows a fifth apparatus embodiment of the present invention. In this embodiment, there is formed a plurality of grooves 83 for giving rotation to discharging gas around a gas discharging outlet 82 in the rear surface of an suction plate 81. Since gas, which is blown from the gas discharging outlet 82, can be rotated by the grooves 83, rotation force can be given to the sucked substrate. If the substrate is rotated in the above-mentioned manner, a film can be formed to have an uniform layer.

In the above-mentioned embodiments, one nozzle (gas discharging outlet) is formed in the center of the suction plate. However, the number of the nozzle and the position of the arrangement are not limited to the above-mentioned embodiments.

FIG. 15 shows a sixth apparatus embodiment of the present invention. In this embodiment, three gas discharging outlets 92 are formed in the rear surface of a suction plate 91. It is preferable that these gas discharging outlets 92 be equidistant from the center of the suction plate 91 and the surroundings of the suction plate 91. Also, it is preferable that these gas discharging outlet 92 be arranged at the position where a point of intersection of the line, which connects to three gas discharging outlets 92, is consistent with center of gravity of the substrate (wafer). By use of the above-explained structure, suction power of the substrate can be increased.

In the apparatus explained in the above embodiments, the suction plate is disc-shaped. However, the present invention is not limited to these embodiments and the other shape may be used.

Also, various modifications may be, of course, made within the scope of the gist of the invention.

What is claimed is:

1. A semiconductor processing apparatus comprising:
   a containing unit;
   a suction plate provided in said containing unit, having a blowing port for blowing gas, and sucking a semiconductor substrate thereto by gas blown from said blowing port;
   first introducing means, communicated with said blowing port, for introducing carrier gas into said blowing port, said first introducing means including a first pipe communicated with said blowing port in said suction plate for introducing said carrier gas;
   second introducing means, communicated with said first introducing means, for introducing a reactant gas into said first introducing means, said second introducing means including a second pipe connected in the vicinity of said blowing port, for introducing said reactant gas, and for mixing said reactant gas with said carrier gas;
   transferring means for transferring the semiconductor substrate to a portion in the vicinity of said suction plate;
   heating means, arranged around said first introducing means, for heating the carrier gas introduced into said first introducing means;
   detecting means for detecting the temperature of said suction plate; and
   control means for controlling said heating means in accordance with the temperature detected by said detecting means.

2. The apparatus according to claim 1, wherein said suction plate has a plurality of blowing ports.

3. The apparatus according to claim 1, wherein said first introducing means has a cavity which is formed in an intermediate portion of said first introducing means, and a heating means for heating said carrier gas is formed around said cavity.

4. The apparatus according to claim 1, wherein a peripheral surface of said suction plate is inclined relative to a central portion of said suction plate.

5. A semiconductor processing apparatus comprising:
   a containing unit;
   a suction plate provided in said containing unit, having a blowing port for blowing gas, and sucking a semiconductor substrate thereto by gas blown from said blowing port;
   first heating means provided in said suction plate, for heating the suction plate and the semiconductor substrate;
   first introducing means, communicated with said blowing port, for introducing a carrier gas into said blowing port, said first introducing means including a first pipe communicated with said blowing port in said suction plate for introducing said carrier gas;
   second introducing means, communicated with said first introducing means, for introducing a reactant gas into said first introducing means, said second introducing means including a second pipe connected in the vicinity of said blowing port, for introducing said reactant gas, and for mixing said reactant gas with said carrier gas; and
   second heating means, arranged around said first introducing means, for heating the carrier gas introduced into the first introducing means.

6. A semiconductor processing apparatus comprising:
   a containing unit;
   a suction plate provided in said containing unit, having a blowing port for blowing gas, and sucking a semiconductor substrate thereto by gas blown from said blowing port, wherein said suction plate has a plurality of grooves formed around said blowing port for rotating gas to be blown from said blowing port;
   first introducing means, communicated with said blowing port, for introducing carrier gas into said blowing port, said first introducing means including a first pipe communicated with said blowing port in said suction plate for introducing said carrier gas;
   second introducing means, communicated with said first introducing means, for introducing a reactant gas into said first introducing means, said second introducing means including a second pipe connected in the vicinity of said blowing port, for introducing said reactant gas, and for mixing said reactant gas with said carrier gas;
   transferring means for transferring the semiconductor substrate to a portion in the vicinity of said suction plate;
   heating means, arranged around said first introducing means, for heating the carrier gas introduced into said first introducing means;
   detecting means for detecting the temperature of said suction plate; and
   control means for controlling said heating means in accordance with the temperature detected by said detecting means.

* * * * *